(12) United States Patent
Tran

(10) Patent No.: US 7,087,478 B2
(45) Date of Patent: Aug. 8, 2006

(54) METHODS OF FORMING SEMICONDUCTOR CONSTRUCTIONS

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 155 days.

(21) Appl. No.: 10/624,627

(22) Filed: Jul. 21, 2003

(65) Prior Publication Data
US 2004/0094788 A1    May 20, 2004

Related U.S. Application Data

(62) Division of application No. 10/364,054, filed on Feb. 10, 2003, which is a division of application No. 10/229,336, filed on Aug. 26, 2002.

(51) Int. Cl.
*H01L 21/8238* (2006.01)

(52) U.S. Cl. .................................................. 438/217

(58) Field of Classification Search ........ 438/194–196, 438/217–329, 585–587, 551, 592
See application file for complete search history.

(56) References Cited

U.S. PATENT DOCUMENTS

| | | | |
|---|---|---|---|
| 3,886,003 A | 5/1975 | Takagi et al. | |
| 4,366,338 A | 12/1982 | Turner et al. | |
| 4,570,331 A | 2/1986 | Eaton, Jr. et al. | |
| 4,686,000 A | 8/1987 | Heath | |
| 4,838,991 A | 6/1989 | Cote et al. | |
| 4,937,756 A | 6/1990 | Hsu et al. | |
| 4,985,740 A * | 1/1991 | Shenai et al. ............... 257/342 |
| 5,164,806 A | 11/1992 | Nagatomo et al. | |
| 5,225,704 A | 7/1993 | Wakamiya et al. | |
| 5,355,012 A | 10/1994 | Yamaguchi et al. | |
| 5,369,295 A | 11/1994 | Vinal | |
| 5,397,909 A | 3/1995 | Moslehi | |
| 5,440,161 A | 8/1995 | Iwamatsu et al. | |
| 5,532,107 A | 7/1996 | Oie et al. | |
| 5,534,456 A | 7/1996 | Yuan et al. | |
| 5,635,744 A | 6/1997 | Hidaka et al. | |
| 5,654,573 A | 8/1997 | Oashi et al. | |
| 5,672,526 A | 9/1997 | Kawamura | |
| 5,688,705 A | 11/1997 | Bergemont | |

(Continued)

FOREIGN PATENT DOCUMENTS

EP        0718881        6/1996

(Continued)

OTHER PUBLICATIONS

U.S. Appl. No. 09/876,722, filed Jun. 6, 2001, Scott.

(Continued)

*Primary Examiner*—Scott B. Geyer
(74) *Attorney, Agent, or Firm*—Wells St. John P.S.

(57) ABSTRACT

The invention includes a semiconductor construction having a pair of channel regions that have sub-regions doped with indium and surrounded by boron. A pair of transistor constructions are located over the channel regions and are separated by an isolation region. The transistors have gates that are wider than the underlying sub-regions. The invention also includes a semiconductor construction that has transistor constructions with insulative spacers along gate sidewalls. Each transistor construction is between a pair source/drain regions that extend beneath the spacers. A source/drain extension extends the source/drain region farther beneath the transistor constructions on only one side of each of the transistor constructions. The invention also includes methods of forming semiconductor constructions.

5 Claims, 11 Drawing Sheets

U.S. PATENT DOCUMENTS

| | | | |
|---|---|---|---|
| 5,767,557 | A | 6/1998 | Kizilyalli |
| 5,814,875 | A | 9/1998 | Kumazaki |
| 5,841,185 | A | 11/1998 | Ishikawa |
| 5,856,226 | A | 1/1999 | Wu |
| 5,858,847 | A | 1/1999 | Zhou et al. |
| 5,866,448 | A | 2/1999 | Pradeep et al. |
| 5,866,934 | A | 2/1999 | Kadosh et al. |
| 5,877,056 | A | 3/1999 | Wu |
| 5,893,728 | A | 4/1999 | Hidaka |
| 5,904,530 | A | 5/1999 | Shin |
| 5,923,975 | A | 7/1999 | Rolandi |
| 5,930,614 | A | 7/1999 | Eimori et al. |
| 5,946,568 | A | 8/1999 | Hsiao et al. |
| 5,970,352 | A | 10/1999 | Shiozawa et al. |
| 6,001,707 | A | 12/1999 | Lin et al. |
| 6,008,115 | A | 12/1999 | Jung |
| 6,033,952 | A | 3/2000 | Yasumura et al. |
| 6,060,364 | A | 5/2000 | Maszara et al. |
| 6,124,168 | A | 9/2000 | Ong |
| 6,144,079 | A | 11/2000 | Shirahata et al. |
| 6,180,468 | B1 | 1/2001 | Yu et al. |
| 6,187,624 | B1 | 2/2001 | Huang |
| 6,194,276 | B1 | 2/2001 | Chan et al. |
| 6,204,536 | B1 | 3/2001 | Maeda et al. |
| 6,207,510 | B1 | 3/2001 | Abeln et al. |
| 6,228,731 | B1 | 5/2001 | Liaw et al. |
| 6,242,329 | B1 | 6/2001 | Huster et al. |
| 6,251,744 | B1 | 6/2001 | Su et al. |
| 6,277,720 | B1 | 8/2001 | Doshi et al. |
| 6,297,082 | B1 | 10/2001 | Lin et al. |
| 6,297,132 | B1 | 10/2001 | Zhang et al. |
| 6,331,458 | B1 | 12/2001 | Anjum et al. |
| 6,359,319 | B1 | 3/2002 | Noda |
| 6,362,034 | B1 | 3/2002 | Sandford et al. |
| 6,380,598 | B1 | 4/2002 | Chan |
| 6,420,749 | B1 | 7/2002 | Divakaruni et al. |
| 6,429,079 | B1 | 8/2002 | Maeda et al. |
| 6,429,491 | B1 | 8/2002 | Schnaitter |
| 6,436,747 | B1 | 8/2002 | Segawa et al. |
| 6,444,548 | B1 | 9/2002 | Divakaruni et al. |
| 6,451,704 | B1 | 9/2002 | Pradeep et al. |
| 6,458,666 | B1 | 10/2002 | Wasshuber |
| 6,468,865 | B1 | 10/2002 | Yang et al. |
| 6,479,330 | B1 | 11/2002 | Iwamatsu et al. |
| 6,492,694 | B1 | 12/2002 | Noble et al. |
| 6,506,647 | B1 | 1/2003 | Kuroda et al. |
| 6,512,269 | B1 | 1/2003 | Bryant et al. |
| 6,515,899 | B1 | 2/2003 | Tu et al. |
| 6,518,113 | B1 * | 2/2003 | Buynoski .................. 438/217 |
| 6,521,487 | B1 | 2/2003 | Chen et al. |
| 6,552,401 | B1 | 4/2003 | Dennison |
| 6,570,233 | B1 | 5/2003 | Matsumura |
| 6,586,803 | B1 | 7/2003 | Hidaka et al. |
| 6,599,792 | B1 | 7/2003 | Jung |
| 6,607,979 | B1 | 8/2003 | Kamiyama |
| 6,627,524 | B1 | 9/2003 | Scott |
| 6,638,441 | B1 | 10/2003 | Chang et al. |
| 6,642,581 | B1 | 11/2003 | Matsuda et al. |
| 6,673,703 | B1 | 1/2004 | Menut et al. |
| 6,750,150 | B1 | 6/2004 | Chung et al. |
| 2001/0006752 | A1 | 7/2001 | Watanabe et al. |
| 2001/0036713 | A1 | 11/2001 | Rodder et al. |
| 2002/0006693 | A1 | 1/2002 | Matsuda |
| 2002/0034865 | A1 | 3/2002 | Umimoto et al. |
| 2002/0043692 | A1 | 4/2002 | Maeda et al. |
| 2002/0164846 | A1 | 11/2002 | Lin et al. |
| 2002/0182829 | A1 | 12/2002 | Chen |
| 2003/0030112 | A1 | 2/2003 | Wada et al. |
| 2003/0071310 | A1 | 4/2003 | Salling et al. |
| 2003/0189231 | A1 | 10/2003 | Clevenger et al. |

FOREIGN PATENT DOCUMENTS

| | | | |
|---|---|---|---|
| JP | | 04105328 A | 4/1992 |

OTHER PUBLICATIONS

U.S. Appl. No. 10/133,193, filed Apr. 26, 2002, McQueen et al.

Young et al., "A 0.13 µm CMOS Technology with 193 nm Lithography and Cu/Low-k for High Performance Applications", IEDM, pp. 563-566, Apr. 2000.

Yeh et al., "Optimum Halo Structure for Sub-0.1 µm CMOSFETs", IEEE Transactions on Electronic Devices, vol. 48, No. 10, Oct. 2001, pp. 2357-2362.

Bouillon et al., "Re-examination of Indium implantation for a low power 0.1 µm technology", IDEM, pp. 897-900, 1995 (year is sufficient so that date is not in issue).

Watanabe, H. et al., *Novel 0.44 µm$^2$ Ti-Salicide STI Cell Technology for High-Density NOR Flash Memories and High Performance Embedded Application*, IEEE 1998, pp. 36.2.1-36.2.4.

Wolf, S., "*Silicon Processing for the VLSI Era*", vol. 2, pp. 632-635.

Mitsubishi Electric Website: Reprinted from website http://www.mitsubishielectric.com/r_and_d/tech_showcase/ts8.php on Mar. 29, 2001: "8. Production Line Application of a Fine Hole Pattern-Formation Technology for Semiconductors", on Mar. 29, 2001, 4 pgs.

Cahners Semiconductor International Website: Reprinted from http://www.semiconductor.net/semiconductor/issues/1999/sep99/docs/feature1.asp on Mar. 29, 2001: "*Resists Join the Sub-λ Revolution*", 9 pgs.

Cahners Semiconductor International Website: Reprinted from http://www.semiconductor.net/semiconductor/issues/1999/aug99/docs/lithography.asp on Mar. 29, 2001: "*Paths to Smaller Features*", 1 pg.

Wolf, S., "*Silicon Processing for the VLSI Era*, vol. 1: *Process Technology*," Lattice Press 1986, pp. 434-437.

"Session 18: Integrated Circuits and Manufacturing—DRAM and Embedded DRAM Technology," 2001 IEDM Technical Program, 2001 IEEE International Electron Devices Meeting, Dec. 4, 2001, reprinted Nov. 15, 2001 from http://www.his.com/~iedm/techprogram/sessions/s18.html., pp. 1-2.

Wolf et al., *Silicon Processing for the VLSI Era*, vol 1: "*Process Technology*," Second Edition, Lattice Press 2000, pp. 12-13, 25-27.

S.M. Sze, VLSI Technology, Second Edition, McGraw-Hill, 1988, pp. 472-483.

Wolf et al., Silicon Processing for the VLSI Era, vol. 1-Process Technology, Second Edition, Lattice Press, 2000, pp. 515-517.

Wolf et al., Silicon Processing for the VLSI Era, vol. 1-Process Technology, Second Edition, Lattice Press, 2000, pp. 527-531.

* cited by examiner

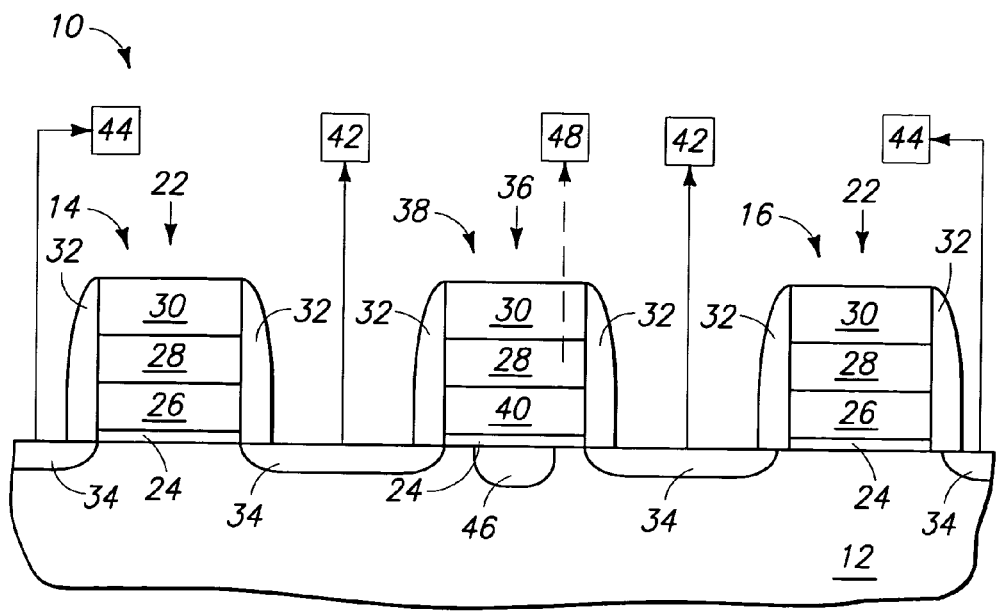
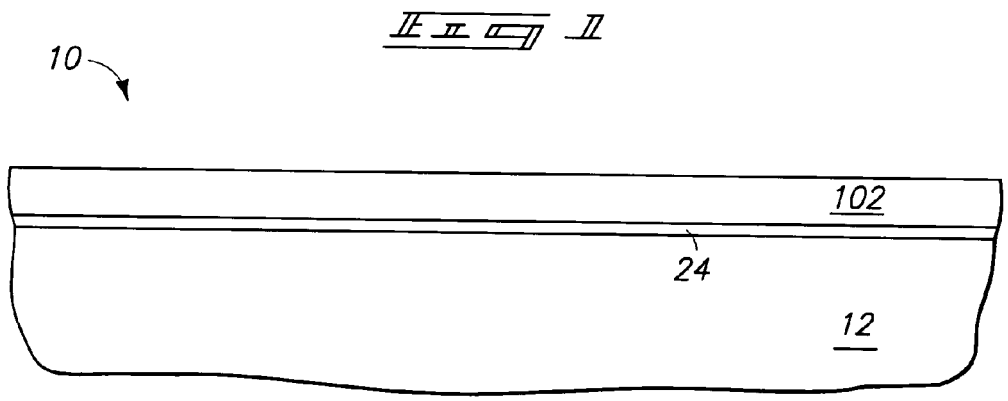
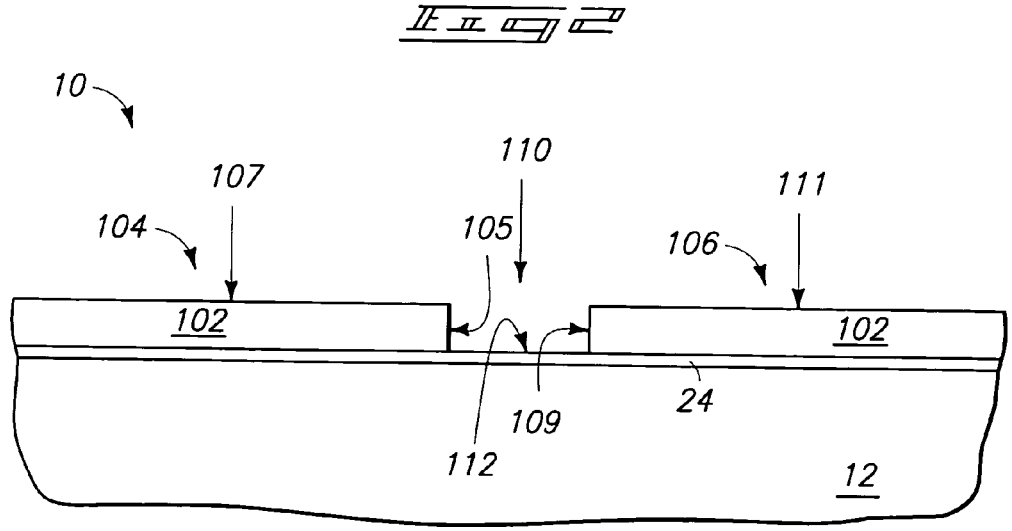

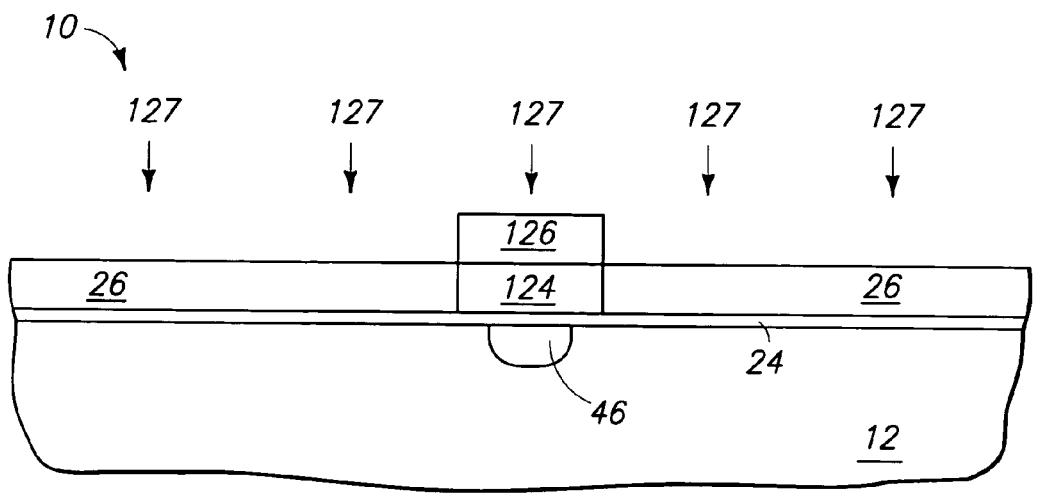
_Fig. 10_
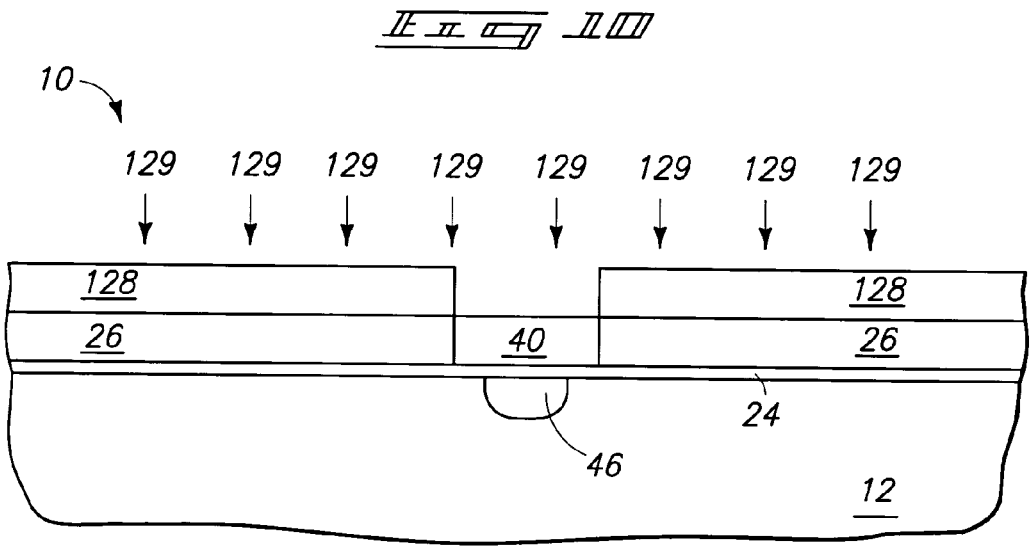
_Fig. 11_
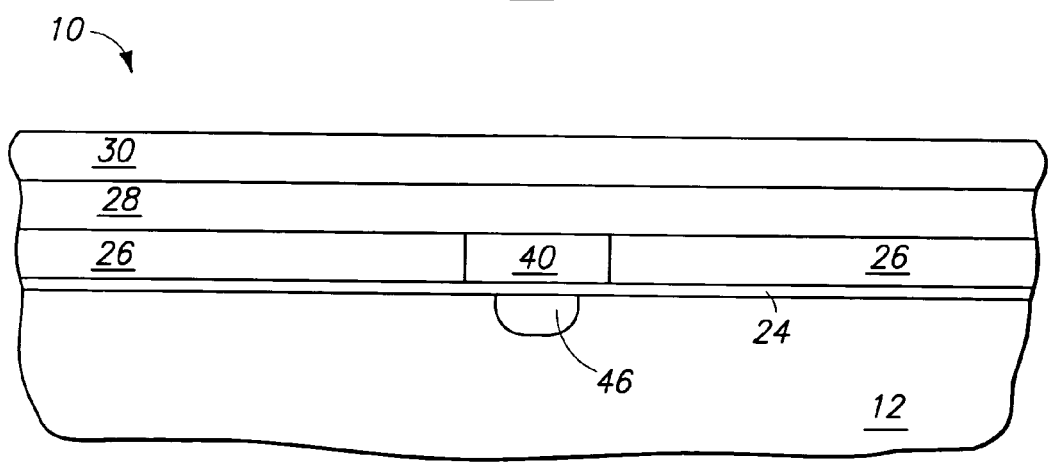
_Fig. 12_

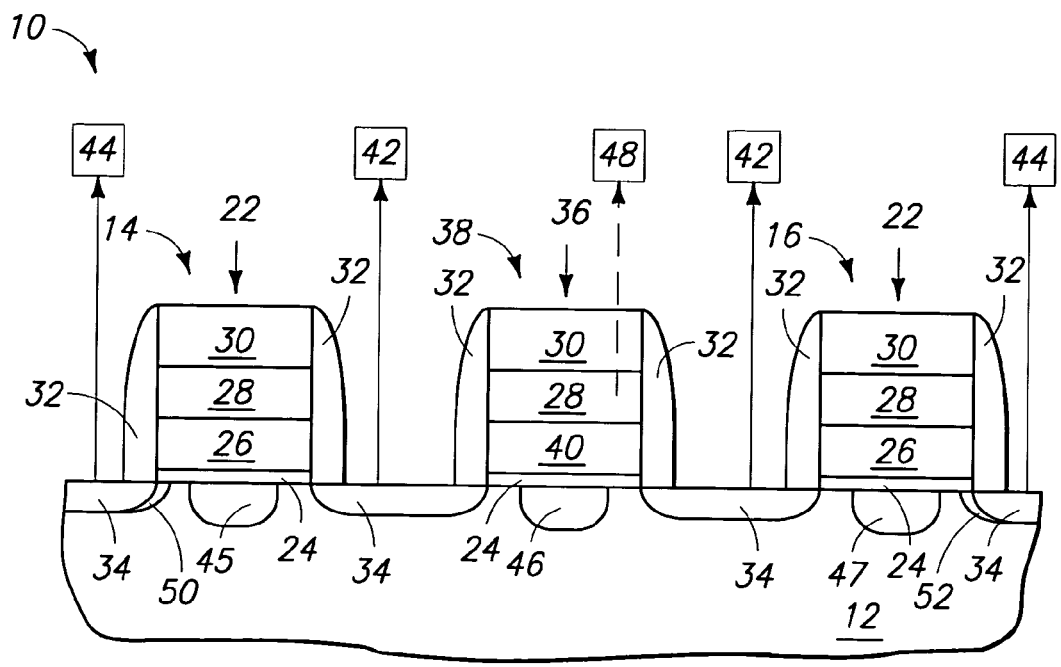

METHODS OF FORMING SEMICONDUCTOR CONSTRUCTIONS

RELATED PATENT DATA

This application is a divisional of U.S. patent application Ser. No.: 10/364,054 filed on Feb. 10, 2003, which is a divisional of U.S. patent application Ser. No.: 10/229,336, filed on Aug. 26, 2002.

TECHNICAL FIELD

The invention pertains to semiconductor constructions and methods of forming semiconductor constructions. In particular aspects, the invention pertains to methods of forming DRAM constructions.

BACKGROUND OF THE INVENTION

Electrical isolation is commonly utilized in semiconductor constructions to alleviate, or prevent, leakage between electrical devices. For instance, it is frequently desired in dynamic random access memory (DRAM) fabrication to avoid sub-threshold leakage between access devices (such as, for example, access transistor constructions). There can be several facets which influence leakage currents between field effect transistor devices, including, for example, junction leakage in source/drain regions; drain-induced barrier lowering (DIBL) due to short gate lengths; gate-induced drain leakage (GIDL) due to high electric fields in a gate overlap region; narrow-width effects; and stress-induced leakage current (SILC) due to a proximity of an isolation region to a device.

A ratio of $I_{on}$ (drive current) to $I_{off}$ (sub-threshold leakage) can be utilized as a figure of merit for determining if access devices are performing adequately. It is found that reducing gate oxide thickness of access devices can improve a sub-threshold behavior of the devices while simultaneously increasing a drive current. However, a threshold voltage of a device reduces with the decrease in gate oxide thickness. Increasing dopant levels in channels of the devices can increase the threshold voltage to an acceptable level and compensate for the reduction in gate oxide thickness, but can increase junction leakage in source/drain regions. Additionally, the increased dopant level in a channel of a device can adversely cause junction capacitance to increase, cause channel mobility reduction, and reduce the current drive of the device.

It would be desirable to develop new methods for reducing sub-threshold leakage of devices. It would be further desirable if such new methods avoided increasing dopant concentration in channel regions of access devices. Additionally, it would be desirable if such new methods could be utilized for forming structures suitable for electrical isolation in an integrated circuit construction.

SUMMARY OF THE INVENTION

In one aspect, the invention encompasses a semiconductor construction having a pair of channel regions within a semiconductor substrate. Each of the channel regions has a sub-region which is doped with indium or heavy atom acceptor atoms such as Ga or Tl. The channel also contains boron surrounding the sub-region. A pair of transistor constructions is disposed over the semiconductor substrate, each of the transistor constructions is disposed over one of the channel regions. The pair of transistor constructions is separated by an isolation region which isolates the transistor constructions from one another. Each transistor construction has a transistor gate that is substantially laterally centered over the corresponding channel region. Each of the gates is wider than the underlying indium doped sub-region.

In one aspect, the invention encompasses a semiconductor construction having a first and a second transistor construction over a semiconductive substrate material. Each of the first and second transistor constructions has opposing sidewalls and a pair of insulative spacers along the sidewalls. The first transistor construction is disposed between a first and a second source/drain region within the substrate. A first end of the first source/drain region extends beneath the spacer on a first side of the first transistor construction and the second source/drain region extends beneath the spacer on an opposing second side of the first transistor construction. The second transistor construction is disposed between a third and a fourth source/drain region within the substrate. A first side of the fourth source/drain region extends beneath the spacer on a first side of the second transistor construction. The third source/drain region extends beneath the spacer on an opposing second side of the second transistor construction. The first, second, third and fourth source/drain regions are commonly doped with a first type of dopant. A source/drain extension which is doped with a second type of dopant is associated with the first side of the first source/drain region and extends the first side of the first source/drain region farther beneath the first transistor construction. Source/drain extensions are absent from a second side of the first source/drain region and are also absent from the second source/drain region.

The invention also encompasses methods of forming semiconductor constructions.

BRIEF DESCRIPTION OF THE DRAWINGS

Preferred embodiments of the invention are described below with reference to the following accompanying drawings.

FIG. 1 is a diagrammatic, cross-sectional view of a fragment of a semiconductor wafer construction which can be formed in particular embodiments of the present invention.

FIG. 2 is a diagrammatic, cross-sectional view of a fragment of a semiconductor wafer construction at a preliminary stage of a fabrication sequence which can be utilized in forming the FIG. 1 structure.

FIG. 3 is a view of the FIG. 2 wafer fragment shown at a processing stage subsequent to that of FIG. 2.

FIG. 10 is a view of the FIG. 2 fragment shown at a processing stage subsequent to that of FIG. 9.

FIG. 11 is a view of the FIG. 2 fragment shown at a processing stage subsequent to that of FIG. 10.

FIG. 12 is a view of the FIG. 2 fragment shown at a processing stage subsequent to that of FIG. 11.

FIG. 22 is a diagrammatic, cross-sectional view of a fragment of a semiconductor wafer construction which can be formed in a fourth embodiment of the present invention.

FIG. 23 is a view of the FIG. 2 fragment shown at an alternative processing stage of a construction similar to that shown in FIG. 14.

DETAILED DESCRIPTION OF THE PREFERRED EMBODIMENTS

Figure 4:
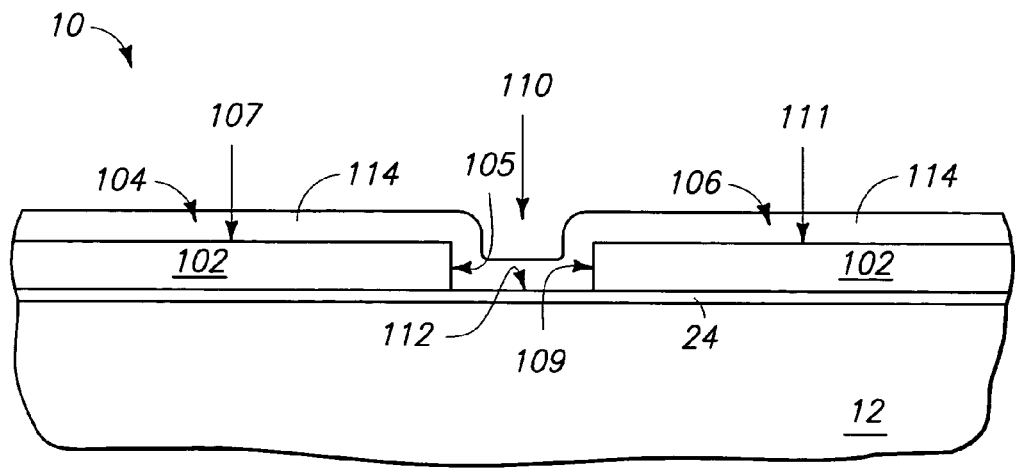
FIG. 4 is a view of the FIG. 2 fragment shown at a processing stage subsequent to that of FIG. 3.

FIG. 1 illustrates a semiconductor construction 10 encompassed by particular aspects of the present invention. Construction 10 comprises a substrate 12. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In particular aspects, construction 10 can correspond to a DRAM array. Construction 10 comprises a pair of field effect transistor devices 14 and 16 supported by substrate 12, and also comprises a device 38 having a different threshold voltage than devices 14 and 16. Device 38 can be utilized for electrically isolating devices 14 and 16 from one another as discussed below.

Each of devices 14 and 16 comprises a transistor gate stack 22 which includes an insulative material 24, a conductively doped semiconductive material 26 (also referred to as a gate layer), an electrically conductive mass 28, and an insulative cap 30.

Insulative material 24 can comprise, for example, one or more of silicon nitride, silicon dioxide and silicon oxynitride. Insulative material 24 typically comprises silicon dioxide, and can be referred to as gate oxide.

Conductively-doped material 26 can comprise, for example, conductively-doped silicon. The silicon is typically in an amorphous and/or polycrystalline form. The dopant can comprise n-type dopant (such as, for example, phosphorous or arsenic), or can comprise p-type dopant (such as, for example, boron).

Conductive mass 28 will typically comprise a layer of silicide formed directly on an upper surface of a silicon material 26; or a layer of metal formed directly on (i.e. physically against) a barrier layer of $WN_x$ or TiN, which in turn is on the silicon material 26.

Insulative cap 30 can comprise, for example, one or both of silicon nitride and silicon dioxide.

The gate stacks comprise sidewalls, and electrically insulative spacers 32 are formed along such sidewalls. Spacers 32 can comprise, for example, silicon nitride, and can be formed by depositing a material conformally over substrate 12 and gate stacks 22, and subsequently anisotropically etching such material.

A plurality of source/drain regions 34 are provided within substrate 12 and between gate stacks 22. Gate stacks 22 can be considered as being directly over segments of substrate 12, and source/drain regions 34 can be considered as being spaced from one another by at least portions of such segments. In the shown constructions, source/drain regions 34 extend the entire spacer width under spacers 32.

Source/drain regions 34 are conductively-doped diffusion regions extending into substrate 12. Typically, transistor constructions 14 and 16 will be NMOS transistors, and accordingly source/drain regions 34 will be n-type doped diffusion regions. In other words, the majority dopant within diffusion regions 34 will be n-type dopant. The term "majority dopant" refers to the dopant that is most abundant within the regions. Accordingly, if both p-type and n-type dopant are present in the regions, the majority dopant type will be that which is most prevalent. Additionally, it is noted that the stack 36 (discussed in more detail below) provided between stacks 22 can be incorporated into an NMOS transistor if a sufficient threshold voltage is provided.

The source/drain regions 34 extend under spacers 32 in the shown construction. It is to be understood however that other structures can be formed in which the source/drain regions do not extend underneath the spacers, or even in which at least some of the spacers are eliminated. Additionally, source/drain regions 34 can extend beneath spacers 32 less than the full spacer width, can extend the full spacer width or can extend beyond the spacer to beneath the corresponding stack (not shown).

The various source/drain regions are connected to either capacitor constructions 42 or digit lines 44 to define various memory cell units of the DRAM memory array.

An isolation region 38 extends between transistor constructions 14 and 16, and can be utilized to electrically isolate such transistor constructions from one another. Isolation region 38 comprises stack 36 similar to stacks 22 of gate constructions 14 and 16. Stack 36 comprises the insulative material 24, conductive mass 28 and insulative cap 34 utilized in gate stacks 22. However, in particular embodiments stack 36 can differ from gate stacks 22 in having a heavily doped material 40 which is differentially doped than the material 26 of stacks 22.

In particular aspects, material 40 can comprise silicon doped with significant concentrations of an opposite type dopant as that primarily utilized in source drain regions 34. For instance, if source/drain region 34 primarily comprised n-type dopant, material 40 can primarily comprise p-type dopant. The utilization of p-type dopant as a majority dopant within doped gate layer 40, while having source/drain regions 34 with n-type dopant as majority dopant, can cause stack 40 to have a high threshold voltage relative to adjacent devices. This can enable stack 36 to function primarily as an isolation region at particular threshold voltages utilized to drive adjacent devices, rather than as a transistor construction. In some aspects of the invention, material 40 can comprise significant concentrations of both p-type and n-type dopant, and can, for example, comprise concentrations from $1\times10^{18}$ atoms/cm$^3$ to $5\times10^{21}$ atoms/cm$^3$ of both p-type and n-type dopants. Typically, a concentration of the dopant can be about $1\times10^{20}$ atoms/cm$^3$.

In particular embodiments of the present invention, material 40 can comprises essentially one type of dopant (i.e. at least 99% of the dopant within material 54 can be p-type) or material 40 can effectively comprise two types of dopant (in other words, less than 99% of the dopant within material 40 is p-type). Alternatively, material 40 can be majority n-doped and coupled to a suitable electrical bias so that isolation device 38 appropriately functions as a grounded gate.

If stack 36 is utilized as an isolation region, it can be described as an isolation region having a mass 40 of material extending between a pair of adjacent source/drain regions 34. Further, the adjacent source/drain regions can, as shown, extend the full spacer-width under spacers 32 associated with stack 36. Alternatively, the adjacent source/drain regions 32 can extend a partial spacer-width beneath spacers 32 or can extend under the gate electrode (i.e. can extend under mass 40).

Stack 36 is shown having conductive layer 28 in contact with other electrical circuitry 48. In embodiments in which stack 36 is utilized as an isolation region, the other circuitry 48 can be an electrical ground associated with construction 10, or can be slightly positive or negative relative to ground as long as device 36 does not turn on an underlying channel.

As a result of the dopant variation within layer 40 (relative to layers 26 of gate stacks 22) the apparent or effective thickness of gate oxide 24 within stack 36 can change relative to that of stacks 22. In other words, even though gate oxide 24 has the same physical thickness in stacks 22 and stack 36, the effective electrical thickness of the gate oxide will be increased in stack 36 relative to stacks 22.

In particular aspects of the present invention, there is an effective dopant depletion relative to an interface between gate oxide 24 and silicon layer 40. Specifically, silicon layer 40 has a lower effective concentration of n-type dopant than do silicon layers 26. Such can be accomplished by initially providing layer 40 to have the same n-type dopant concentration as do layers 26, and subsequently adding sufficient p-type dopant to layer 40 to alter electrically properties of layer 40. The p-type dopant concentration can be sufficient to overwhelm the n-type dopant concentration (i.e. to form the p-type dopant as the majority dopant in layer 40), or alternatively can be sufficient to simply have a measurable effect on the work function of a transistor construction comprising stack 36.

A doped pocket region 46 can be provided within a semiconductive material of substrate 12 beneath isolation structure 38. Doped pocket region 46 can be doped with a heavy p-type atom such as, for instance, indium. Optionally, doped region 46 can additionally be doped with at least one other p-type dopant such as, for example, boron. It can be advantageous to provide indium or other heavy p-type dopant, such as Ga or Tl, in the pocket region 46 beneath isolation structure 38 to increase the threshold voltage of isolation gate 36. Further, indium within pocket region 46 can enhance retention of dopant centrally beneath isolation device 38. The relatively low diffusivity of indium can minimize diffusion of dopant toward the storage node junction and thereby minimize junction leakage. When used in conjunction with an additional p-type dopant such as, for example, boron, a lower dosage of the additional p-type dopant can be utilized relative to concentrations typically used to minimize charge leakage between nodes across a grounded gate device 38.

Indium can be provided within pocket region 46 to a concentration of from about $1\times10^{12}$ atoms/cm$^3$ to about $1\times10^{13}$ atoms/cm$^3$. If pocket region 46 is additionally doped with boron, boron can be provided to a concentration of from about $1\times10^{12}$ atoms/cm$^3$ to about $2\times10^{12}$ atoms/cm$^3$.

Activation of implanted indium can comprise activation by thermal processing at a temperature of about 900° C. for between about 1 minute and about 6 minutes, preferably from about 1 minute to about 2 minutes. Such activation can occur during a reflow of borophosphosilicate glass (BPSG) or can occur in an independent step.

Doped region 46 preferably has a lateral width that is less than the width of gate stack 36. Preferably, pocket region 46 is substantially centered beneath device 38 and comprises a lateral width that is less than or equal to the total width of device 38, the total width of device 38 being the furthest distance between outer edges of the pair of sidewall spacers 32 associated with gate stack 36. In a preferred configuration, the heavy p-type atom dopant in doped region 46 is separated from each neighboring source/drain region 34 by a gap.

It is noted that in embodiments where boron is implanted into doped pocket region 46, at least some of the initially implanted boron can diffuse outwardly from region 46 during activation or other thermal processing. In preferred embodiments however, heavy p-type dopant remains substantially within pocket region 46, thereby avoiding high concentrations of p-type dopant at or near the storage node junctions. Accordingly, the doped pocket region can be referred to as a sub-region of a doped region.

Although FIG. 1 shows heavily doped material 40 of gate stack 36 utilized in conjunction with doped channel region 46, the invention encompasses embodiments wherein material 40 is substituted with alternative conductively doped semiconductor material such as the material utilized for layer 26 in gate stacks 22.

In addition to the features shown in FIG. 1, construction 10 can comprise doped channel regions within regions of substrate 12 underlying stacks 22 (not shown). In particular embodiments, doped channel regions beneath the transistor devices can be doped with a non-heavy p-type dopant such as, for example boron. Such boron doped channel regions can lack additionally added heavy p-type dopants and can have boron implanted to a concentration of from about $5\times10^{12}$ atoms/cm$^3$ to about $9\times10^{12}$ atoms/cm$^3$.

In the shown construction 10, material 40 is physically against insulative mass 24, and conductive mass 28 is physically against material 40. Further, conductive mass 28 can comprise a silicide layer which is formed directly on (physically against) layer 40, and can further comprise a metal layer, metal compound layer, and/or metal alloy layer which is formed over and physically against the silicide layer.

Stack 36 can be considered to be within a DRAM array, and the array can be, for example, a 6 $F^2$ or 8 $F^2$ array.

A method of forming the construction of FIG. 1 is described with references to FIGS. 2–13. In describing FIGS. 2–13, similar numbering will be used as was utilized above in describing FIG. 1, as appropriate.

Referring initially to FIG. 2, wafer construction 10 is shown at a preliminary processing stage. Construction 10 comprises substrate 12, insulative layer 24, and a masking material 102 formed over insulative layer 24. Masking material 102 can comprise, for example, either positive or negative photoresist, and in particular embodiments can comprise M108Y™ from JSR™ Corporation of Japan. Referring to FIG. 3, photoresist 102 is photolithographically patterned into a pair of adjacent and spaced blocks 104 and 106. Block 104 has a sidewall edge 105 and a top edge 107. It is to be understood that the term "block" is utilized herein to generically refer to any patterned shape, including for example, rectangular shapes, square shapes or shapes with curved edges.

In the shown embodiment, blocks 104 and 106 are formed in physical contact with insulative material 24. It is to be understood that the invention encompasses other embodiments (not shown) wherein masking material 102 is formed directly on a semiconductive material of substrate 12 in the absence of insulative layer 24 to result in blocks that are physically against substrate 12.

A gap 110 extends between patterned blocks 104 and 106, and in the shown embodiment an upper surface 112 of insulative material 24 is exposed within gap 110. Patterned blocks 104 and 106 can be considered to cover a first portion of insulative layer 24, and to leave a second portion of layer 24 uncovered. In embodiments having material 102 formed in an absence of layer 24 (not shown), patterned blocks 104 and 106 can cover a first portion of substrate 12 and leave a second portion of the substrate material uncovered.

Referring to FIG. 4, a coating 114 is formed over patterned photoresist blocks 104 and 106, and within gap 110. Coating 114 covers at least some of the portion of insulative material 24 that is exposed between blocks 104 and 106, and in the shown embodiment covers all of the exposed portion of insulative material 24. Coating 114 is a material other than photoresist, and in particular applications, corresponds to a material designated as AZ R200™ by Clariant International, Ltd. Coating 114 is physically against photoresist blocks 104 and 106, and corresponds to a material which can be selectively removed from over exposed portion 112 of insulative material 24, while remaining adhered to the photoresist of blocks 104 and 106.

In one aspect of the invention, coating 114 corresponds to the material designated as AZ R200™, and is coated across an entirety of a semiconductive wafer, and is subsequently spun dry. It is noted that AZ R200™ is a water-based material, so it is preferable to conduct the procedures associated with AZ R200™ in a separate chamber from the procedures utilized in exposing and developing photoresist, since water can interfere with standard photoresist processing. Accordingly, a preferred process of the present invention comprises forming a photoresist mass 102 and photolithographically processing such mass in a separate "bowl" or chamber from that utilized during formation of coating 114.

After coating 114 is formed, semiconductor construction 10 is baked at a temperature of from about 100° C. to about 120° C. Such baking is thought to diffuse acid from resist 102 into the AZ R200™, and crosslink the layer of AZ R200™ across resist blocks 104 and 106. The crosslinking can bond the coating to blocks 104 and 106 and/or form the coating into a shell tightly adhered with blocks 104 and 106. The material designated as AZ R200™ is but one material which can be utilized in methodology of the present invention. Other materials which selectively bond or adhere to photoresist blocks 104 and 106 can be used alternatively to the material designated as AZ R200™.

Figure 5:
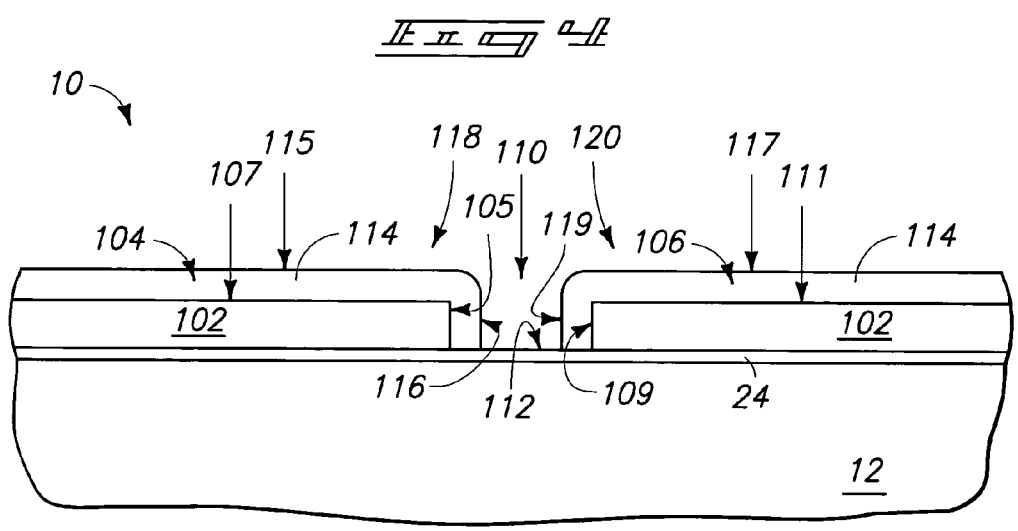
FIG. 5 is a view of the FIG. 2 fragment shown at a processing stage subsequent to that of FIG. 4.

Referring to FIG. 5, coating 114 is exposed to conditions which selectively remove the coating from between blocks 104 and 106, while leaving a layer of the coating against blocks 104 and 106. In applications in which the coating comprises AZ R200™, such removal can be accomplished by exposing semiconductor construction 10 to an aqueous solution comprising surfactant. Such solution can selectively remove a non-crosslinked portion of coating 114. A suitable aqueous surfactant solution is the material marketed as "SOLUTION C™" by Clariant International, Ltd. In applications in which AZ R200™ is utilized, construction 10 can be subjected to a so-called hard bake at a temperature of from about 130° C. to about 140° C. after removal of the non-crosslinked material. Such hard bake can fully dry and further crosslink the portions of coating 114 remaining around blocks 104 and 106.

The coating 114 remaining around a photoresist block can be considered to define a second block which extends laterally outward beyond edges of the photoresist block. Specifically, the coating 114 over photoresist block 104 defines lateral edge 116 which extends laterally outward beyond lateral edge 105 of block 104, and also defines a top edge 115 which extends elevationally above the top edge 107 of block 104. Similarly, the coating 114 around block 106 comprises a lateral edge 119 which extends laterally outward beyond the lateral edge 109 of block 106, and further comprises a top edge 117 which is elevationally above the top edge 111 of block 106.

Photoresist block 104 and the coating 114 surrounding such photoresist block together define a masking block which is enlarged and laterally wider than was photoresist block 104. Also, photoresist block 106 and the coating 114 surrounding such photoresist block together define a masking block 120 which is enlarged and laterally wider than photoresist block 106. Masking blocks 118 and 120 (also referred to as enlarged blocks) have a narrower gap between them than did photoresist blocks 104 and 106. In other words coating 114 narrows gap 110 to reduce a dimension of such gap.

Figure 6:
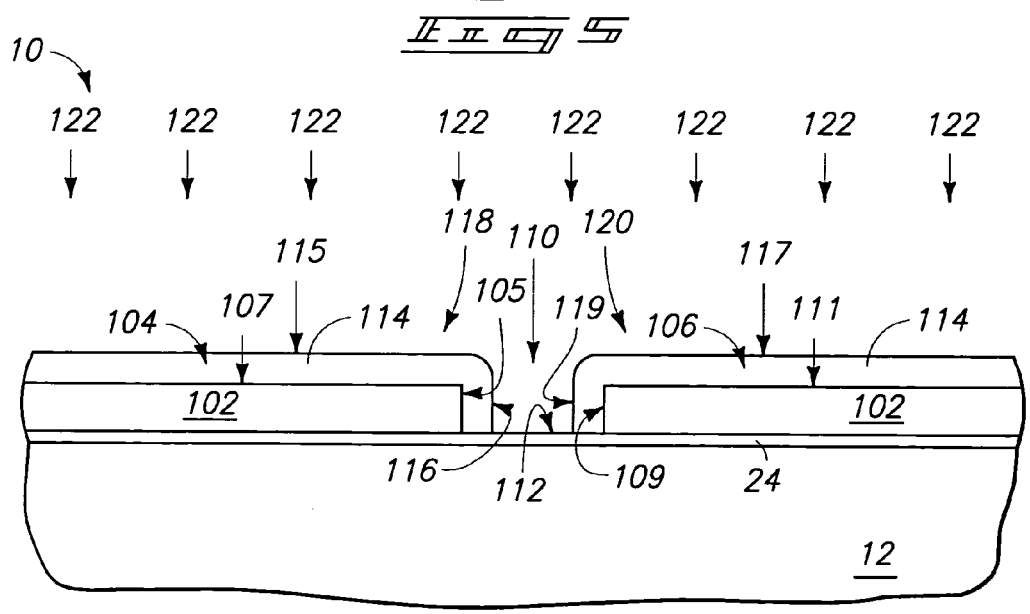
FIG. 6 is a view of the FIG. 2 fragment shown at a processing stage subsequent to that of FIG. 5.
Figure 7:
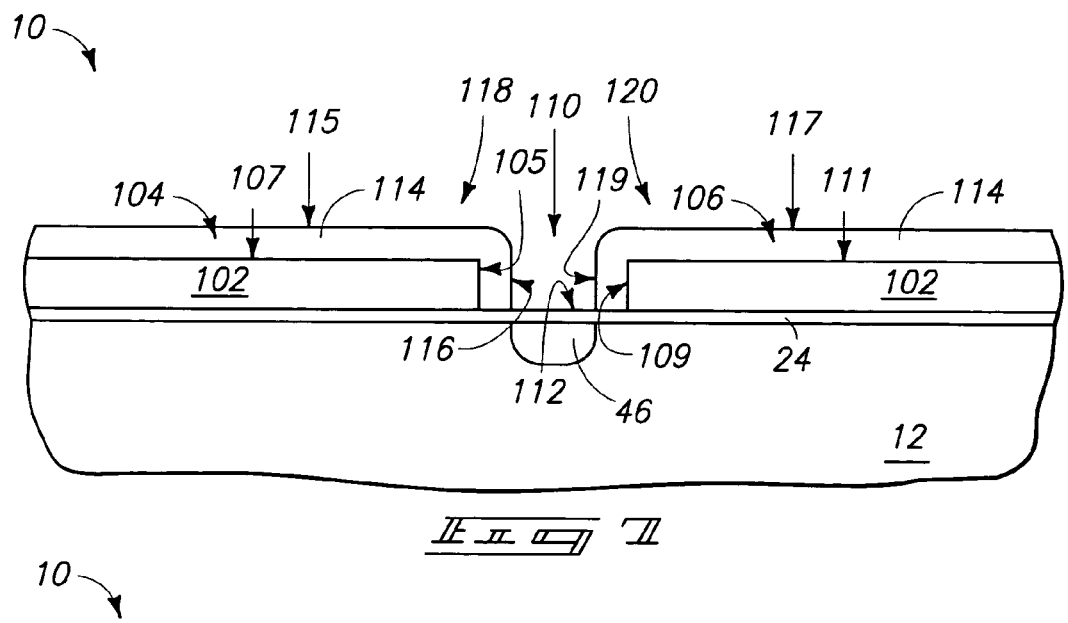
FIG. 7 is a view of the FIG. 2 fragment shown at a processing stage subsequent to that of FIG. 6.

Referring to FIG. 6, a dopant 122 is implanted relative to construction 10. Masking blocks 118 and 120 prevent the dopant from being implanted into the blocked regions of construction 10. The unblocked region corresponds to a region within a surface area where stack 36 (FIG. 1) is ultimately to be formed. Implanting dopant 122 forms a doped pocket region 46 as shown in FIG. 7. Doped pocket region 46 has a width corresponding to the narrowed width of gap 110.

Referring again to FIG. 6, dopant 122 can comprise a single heavy p-type dopant such as indium or can comprise both a heavy p-type dopant and an additional p-type dopant such as, for example, boron. Although FIGS. 6 and 7 depict formation of doped pocket region 46 as utilizing a single doping step, it is to be understood that the present invention encompasses alternative embodiments (not shown), wherein two or more implanting steps are utilized to implant dopant into region 46. For example, a non-heavy p-type dopant such as boron for example can be implanted into exposed region 112 (FIG. 3) prior to forming coating layer 114 over photoresist blocks 104 and 106. Alternatively, a second dopant can be implanted after formation of enlarged blocks 118 and 120 but in an independent step either prior to or subsequent to doping with the heavy p-type dopant.

Dopant 122 can be activated by thermal processing at a temperature of from about 900° C. for about 1 minute to about 6 minutes, preferably from about 1 minute to about 2 minutes. Activation of dopant 122 can occur during reflow of BPSG or in an independent step.

Figure 8:
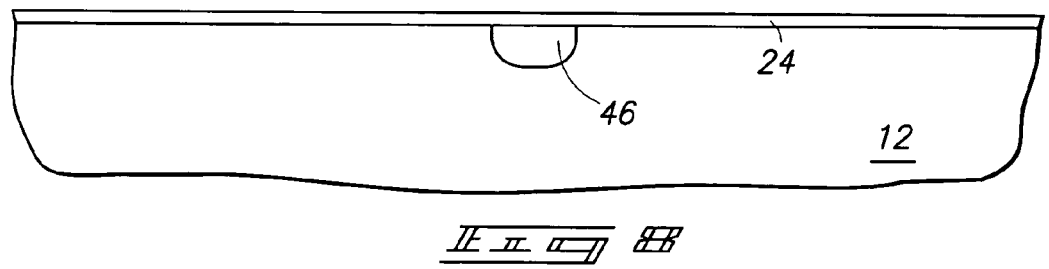
FIG. 8 is a view of the FIG. 2 fragment shown at a processing stage subsequent to that of FIG. 7.

Referring to FIG. 8, materials 102 and 114 (FIG. 5) are removed from over substrate 12.

The present invention can advantageously form doped pocket regions that are narrower than can be accomplished utilizing photolithographic processing alone. Specifically, if photoresist blocks 104 and 106 (FIG. 3) are considered to be as close to one another as is possible by a particular photolithographic patterning process, then processing of the present invention has effectively defined new masking blocks 118 and 120 (FIG. 5) which are closer together than could be achieved by photolithographic processing alone. In other words, if gap 110 was initially formed to have a minimum feature size achievable by photolithographic processing, then the formation of coating 114 has effectively reduced the feature size of gap 110 to below the minimum achievable feature size. In particular embodiments, the reduced width of gap 110 between blocks 118 and 120 can be less than or equal to about half the width of gap 110 between blocks 104 and 106 prior to the formation of coating 114.

In embodiments wherein layer 102 was formed over substrate 12 in an absence of insulative material 24 (not shown), such insulative layer can be formed after the removal of materials 102 and 114 prior to subsequent processing.

In embodiments of the invention having doped channel regions (not shown) underlying gate stacks 22 (FIG. 1) wherein the channel regions are doped only with non-heavy p-type dopants, such channel regions can be formed by implanting dopant into the appropriate areas of the substrate after removal of materials 102 and 114. Alternatively, such channels can be formed prior to formation of layer 102. Formation of such channel regions can comprise implanting boron to a concentration of from about $5\times10^{12}$ atoms/cm$^3$ to about $9\times10^{12}$ atoms/cm$^3$.

Figure 9:
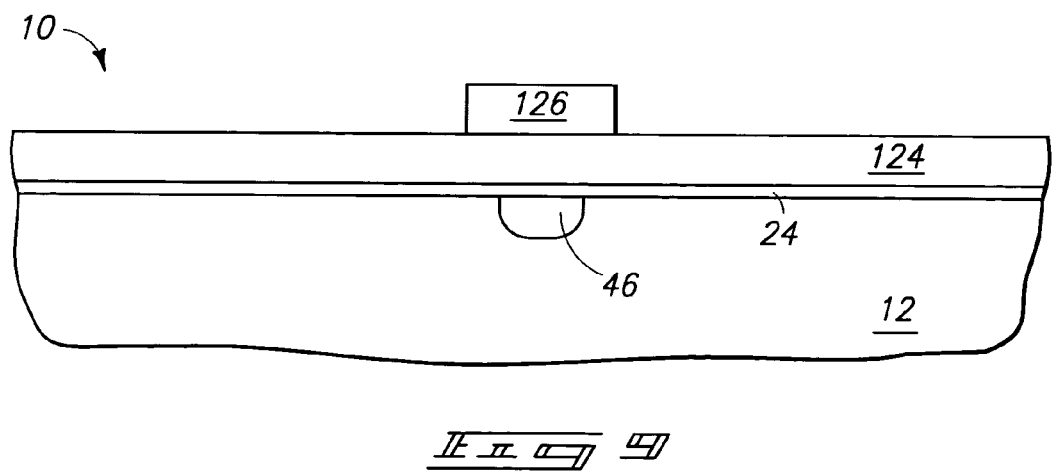
FIG. 9 is a view of the FIG. 2 fragment shown at a processing stage subsequent to that of FIG. 8.

Referring to FIG. 9, mass 124 is formed over insulative layer 24. Mass 124 can be undoped as initially deposited, or alternatively can be in situ doped. In the shown application, mass 124 is undoped, and accordingly has not acquired the properties of either mass 26 (FIG. 1), or mass 40 (FIG. 1).

A patterned masking material 126 is formed over mass 124, and such blocks portions of mass 124. Masking material 126 can comprise, for example, photoresist and can be formed into the shown pattern by, for example, photolithographic processing. Masking material 126 covers a portion of construction 10 where stack 36 is ultimately to be formed while leaving other portions of construction 10 uncovered.

Referring to FIG. 10, a dopant 127 is implanted into construction 10, and specifically is implanted into portions of material 124 (FIG. 9) which are not covered by mask 126. Such converts the material 124 to material 26. Dopant 127 can comprise,for example, n-type dopant (such as phosphorous or arsenic). Dopant 127 can be provided to a concentration of at least $1\times10^{20}$ atoms/cm$^3$, and typically is provided to a concentration of from about $1\times10^{20}$ atoms/cm$^3$ to about $5\times10^{21}$ atoms/cm$^3$.

Referring to FIG. 11, masking material 126 is removed and replaced by another patterned masking material 128. Masking material 128 can comprise, for example, photoresist and can be formed into the shown pattern by, for example, photolithographic processing. Masking material 128 covers some Portion of construction 110 while leaving a portion where stack 36 is ultimately to be formed uncovered.

A dopant 129 is implanted into construction 10, and specifically is implanted into portions of material 124 (FIG. 9) which are not covered by mask 128. Such converts the material to material 40. Dopant 129 can comprise an opposite conductivity type relative to dopant 127. Further, dopant 129 can be implanted to a concentration greater than $1\times10^{20}$ atoms/cm$^3$.

In particular applications mask 126 (FIG. 9) can be eliminated, and dopant 127 implanted into an entirety of material 124 (FIG. 9). Subsequently, mask 128 can be formed and dopant 129 implanted at a concentration higher than that of dopant 127. The dopant 129 can then effectively overwhelm the dopant 127 within exposed (unblocked) region of construction 10 to form doped materials 40 and 26.

Referring to FIG. 12, masking material 128 (FIG. 11) is removed. Layers 28 and 30 are formed across construction 10. As discussed above, layer 28 can comprise silicide, metal, metal compounds and/or metal alloys; and layer 30 can comprise an insulative material such as, for example, silicon dioxide and/or silicon nitride.

Figure 13:
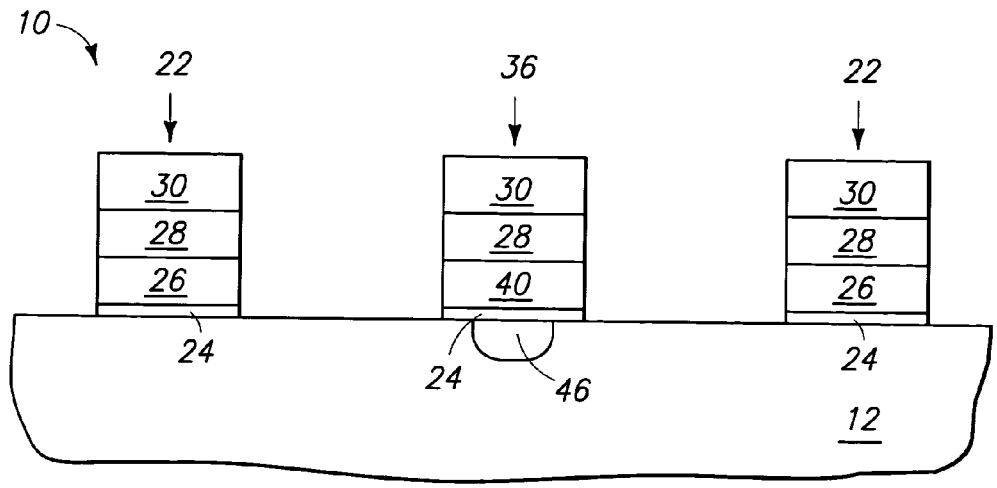
FIG. 13 is a view of the FIG. 2 fragment shown at a processing stage subsequent to that of FIG. 12.

Referring to FIG. 13, stacks 22 and 36 are patterned from the layers 24, 26, 28, 30 and 40 of FIG. 12. Such patterning can be accomplished by, for example, forming a patterned photoresist mask (not shown) over the layers, and subsequently transferring a pattern from the mask through the layers utilizing suitable etching conditions.

The stacks 22 and 36 can be incorporated into the constructions of FIG. 1 by forming source/drain regions 34 (shown in FIG. 1) within substrate 12, and forming sidewall spacers 32 (shown in FIG. 1). Source/drain regions 34 preferably can be formed to extend beneath sidewall spacers 32 of the of the corresponding transistor device 14 and 16 or isolation device 38, without extending beneath the corresponding stack 22 or 36.

Another application of the invention is described with reference to FIGS. 14–20. Similar numbering will be utilized in describing FIGS. 14–20 as was used above in describing FIGS. 1–13 where appropriate.

Figure 14:
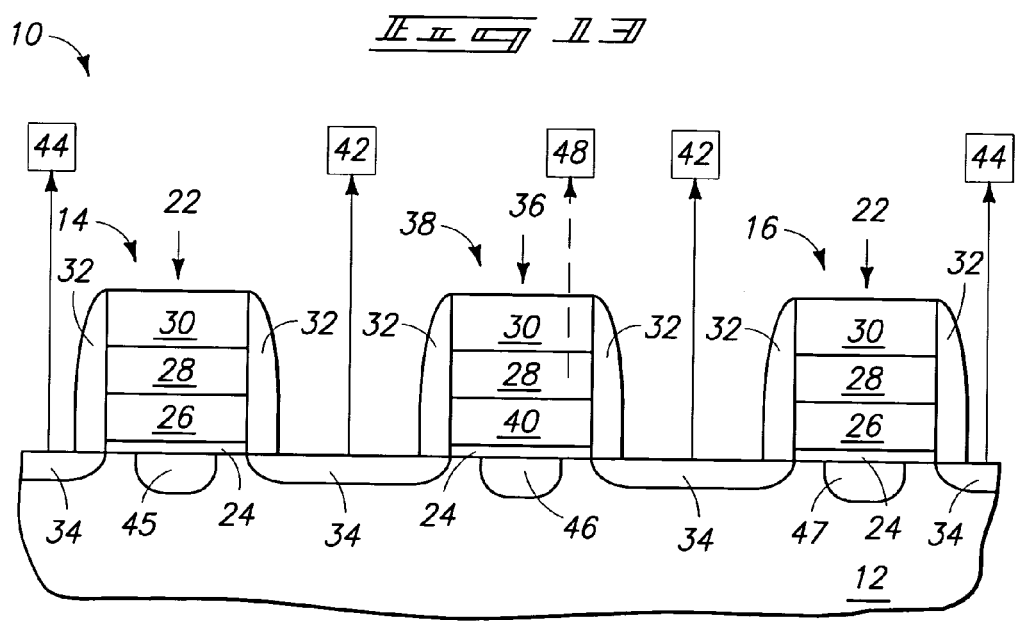
FIG. 14 is a diagrammatic, cross-sectional view of a fragment of a semiconductor wafer construction which can be formed in a second embodiment of the present invention.

Construction 10 shown in FIG. 14 can comprise all of the features shown in FIG. 1, and can additionally comprise one or both of channel pocket implants 45 and 47 within channel regions underlying transistor gate stacks 22. Channel pocket regions 45 and 47 can comprise implants of heavy p-type atoms such as, for example, indium. In particular embodiments, doped pocket regions 45 and 47 and the corresponding surrounding channel area can be additionally doped with a second p-type dopant such as, for example, boron. It can be advantageous to utilize indium pocket implants within a boron doped channel region of transistor devices to decrease the concentration of boron utilized in the channel region. For example, in embodiments of the present invention wherein channel pocket regions 45 and 47 are implanted to an indium concentration of from about $1\times10^{12}$ atoms/cm$^3$ to about $1\times10^{13}$ atoms/cm$^3$, the boron dose utilized in the channel region can be from about $1\times10^{12}$ atoms/cm$^3$ to about $2\times10^{12}$ atoms/cm$^3$ relative to typical boron dosed of from about $5 \times 10^{12}$ atoms/cm$^3$ to about $1 \times 10^{13}$ atoms/cm$^3$ that are utilized in channel regions in the absence of the channel pockets 45 and 47 of the present invention.

Figure 15:
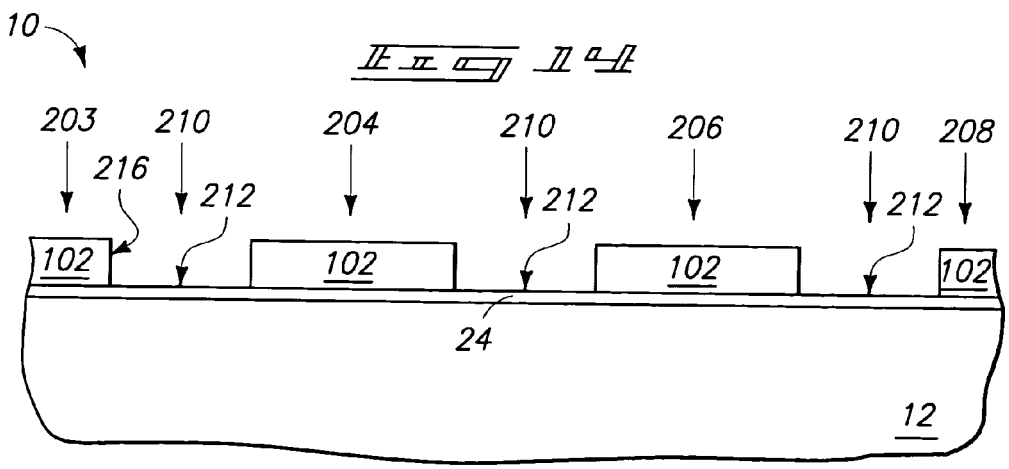
FIG. 15 is a view of the FIG. 2 wafer fragment shown at an alternate processing stage subsequent to that of FIG. 2.

A method for forming the construction of FIG. 14 is described with reference to FIGS. 15–20. In general, the methods utilized in forming the construction shown in FIG. 14 can be as described above in reference to formation of the FIG. 1 construction, combined with the following alternative processing steps. Referring initially to FIG. 15, wafer construction 10 is shown at an alternative processing stage subsequent to FIG. 2. Masking material 102 (FIG. 2) can be patterned utilizing suitable photolithographic processes to form spaced blocks 203, 204, 206 and 208. Gaps 210 extend between patterned blocks 203 and 204, between patterned blocks 204 and 206, and between pattern d blocks 206 and 208. In the shown embodiment, an upper surface 212 of insulative layer 24 is exposed within gaps 210. Alternatively, patterned blocks 203, 204, 206 and 208 can be formed in the absence of layer 24 (not shown) and upper surface 212 can comprise a semiconductive material of substrate 12.

Figure 16:
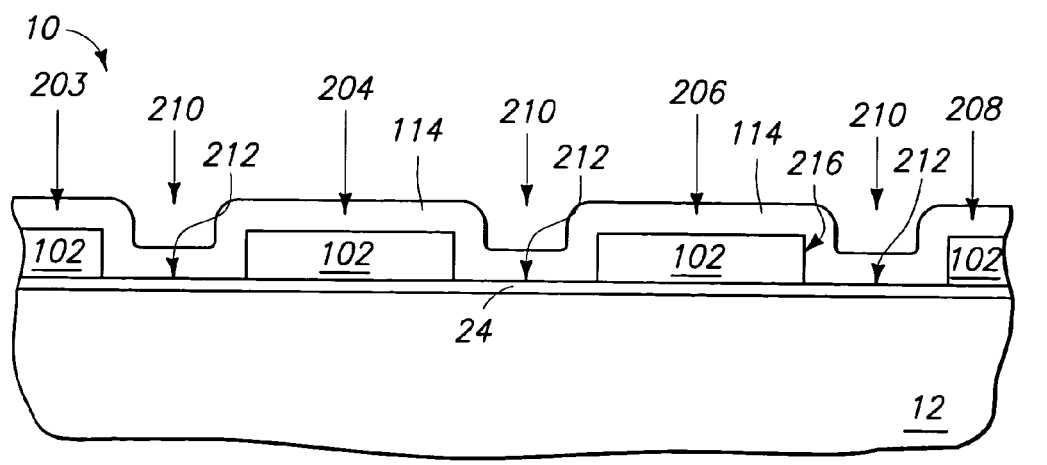
FIG. 16 is a view of the FIG. 2 fragment shown at a processing stage subsequent to that of FIG. 15.
Figure 17:
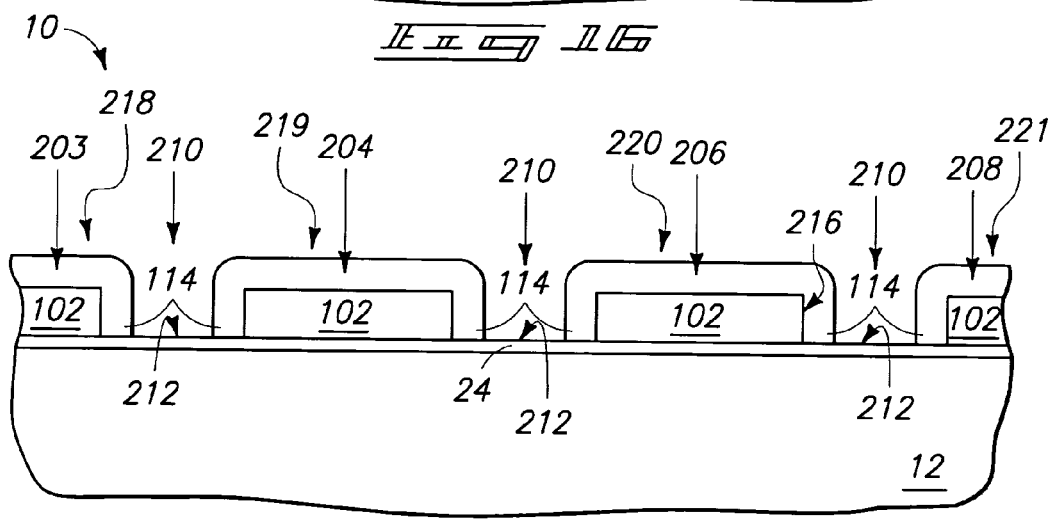
FIG. 17 is a view of the FIG. 2 fragment shown at a processing stage subsequent to that of FIG. 16.

Referring to FIG. 16, coating 114 is formed over patterned photoresist blocks 203, 204, 206 and 208, and within gaps 210. As discussed above, coating 114 can be selectively removed from between the patterned photoresist blocks thereby forming the narrowed gaps 210 as shown in FIG. 17. In particular embodiments, narrowed gaps 210 can comprise a width that is less than or equal to about half the width of the gaps prior to formation of coating 114. As additionally shown in FIG. 17, selective removal of coating 114 can form enlarged blocks 218, 219, 220 and 221.

Figure 18:
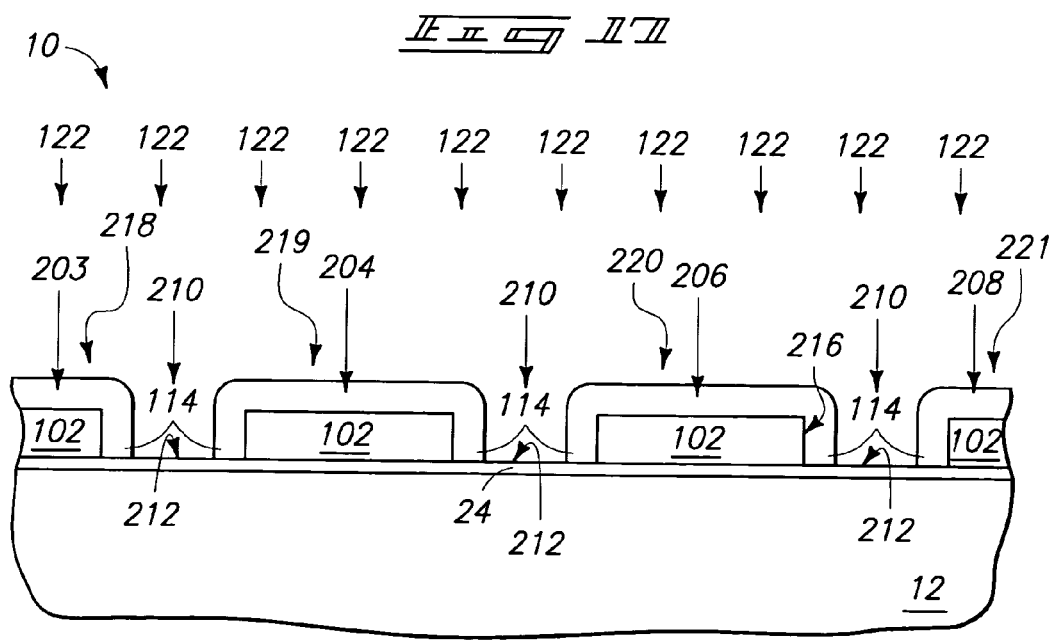
FIG. 18 is a view of the FIG. 2 fragment shown at a processing stage subsequent to that of FIG. 17.

Referring to FIG. 18, a dopant 122 is implanted into construction 10, and specifically is implanted into portions of substrate 12 which are not covered by mask blocks 218, 219, 220 and 221.

Figure 19:
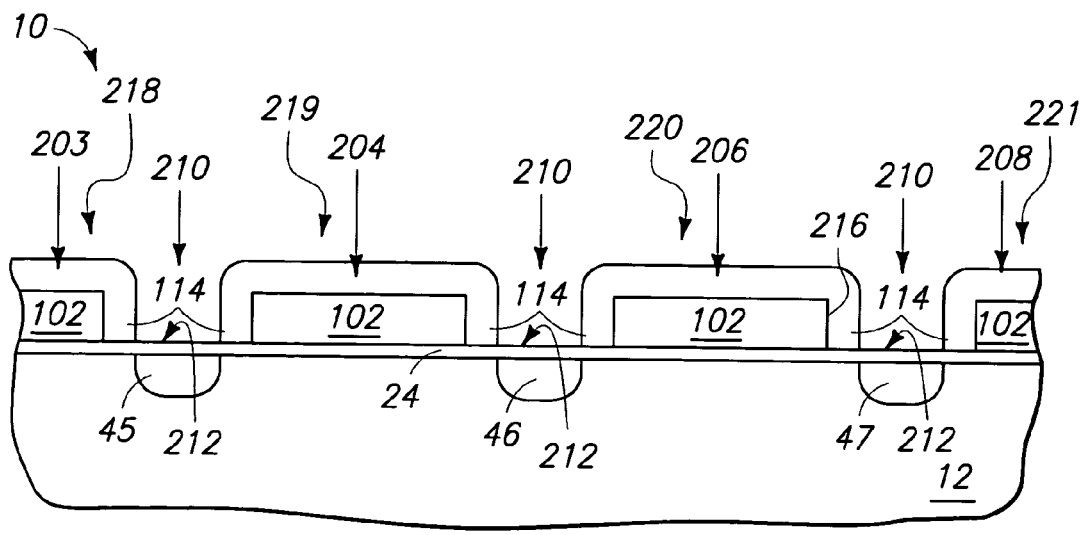
FIG. 19 is a view of the FIG. 2 fragment shown at a processing step subsequent to that of FIG. 18.

Referring to FIG. 19, dopant 122 (FIG. 18) is implanted to form channel pocket regions 45 and 47, and pocket region 46. Such pocket regions have a width corresponding to the width of narrowed gap 210. As discussed above, dopant 122 can comprise indium and in particular embodiments can additionally comprise an additional p-type dopant such as, for example, boron. Accordingly, pocket regions 45, 46 and 47 can be implanted with indium in the absence of additional dopants or can simultaneously be implanted with both indium and, for example, boron. Doped pocket region 46 corresponds to a region of the substrate which will eventually underlie isolation device 38 (FIG. 14). Doped channel pocket region 45 is substantially centrally located within a channel region that will eventually be associated with transistor device 14 (FIG. 14). Similarly, channel pocket region 47 corresponds to a substantially center d subregion within a channel region that will eventually underlie transistor device 16 (FIG. 14).

It is noted that boron and/or other dopants can be implanted into at least one of the channel regions that will underlie devices 14 and 16, or the corresponding region beneath isolation device 38, in an independent doping step that is independent from implanting dopant 122. Such independent step can occur prior to formation of resist blocks 203, 204, 206 and 208 (FIG. 15) or can occur after formation of the patterned resist blocks but prior to formation of enlarged blocks 218, 219, 220 and 221 (FIG. 17). Alternatively, the independent doping can occur after formation of enlarged masking blocks 218, 219, 220 and 221 in an independent step prior to or subsequent to indium implant 122.

Activation of indium can comprise heat processing as described above. Preferably, indium diffusion from the pocket region into the surrounding substrate is minimized. In embodiments having boron additionally implanted, indium doped pockets 45 and 47 can be sub-regions of larger channel regions formed by boron diffusion. In preferred embodiments, the doped pockets 45, 46, and 47 remain narrower than width of the overlying stack. In particular embodiments, the width of the pockets will remain about the width of narrowed gap.

Figure 20:
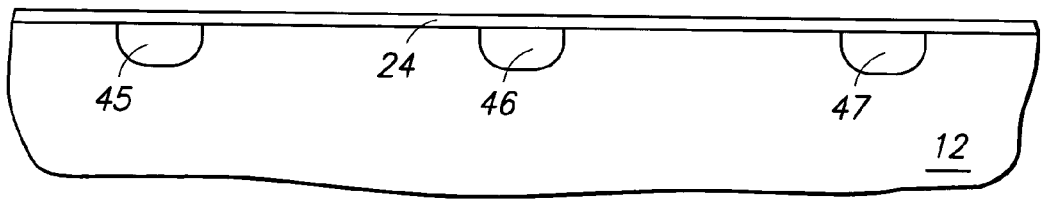
FIG. 20 is a view of the FIG. 2 fragment shown at a processing stage subsequent to that of FIG. 19.

Referring to FIG. 20, masking blocks 218, 219, 220 and 221 are removed from over substrate 112. Semiconductor construction 10, as shown in FIG. 20, can then be processed as discussed above (FIGS. 10–13 and corresponding text) to form the constructions shown in FIG. 14. It can be advantageous to provide indium within channel pocket regions associated with transistor devices to allow a lower concentration of boron or other p-type dopant to be utilized in the channel region, thereby decreasing the amount of dopant that can diffuse toward the storage node junction. High concentrations of p-type dopants at or surrounding a storage node junction can increase charge leakage. Accordingly, decreasing an amount of high diffusivity dopant such as, for example, boron, utilized in the channel region can assist in decreasing leakage.

Figure 21:
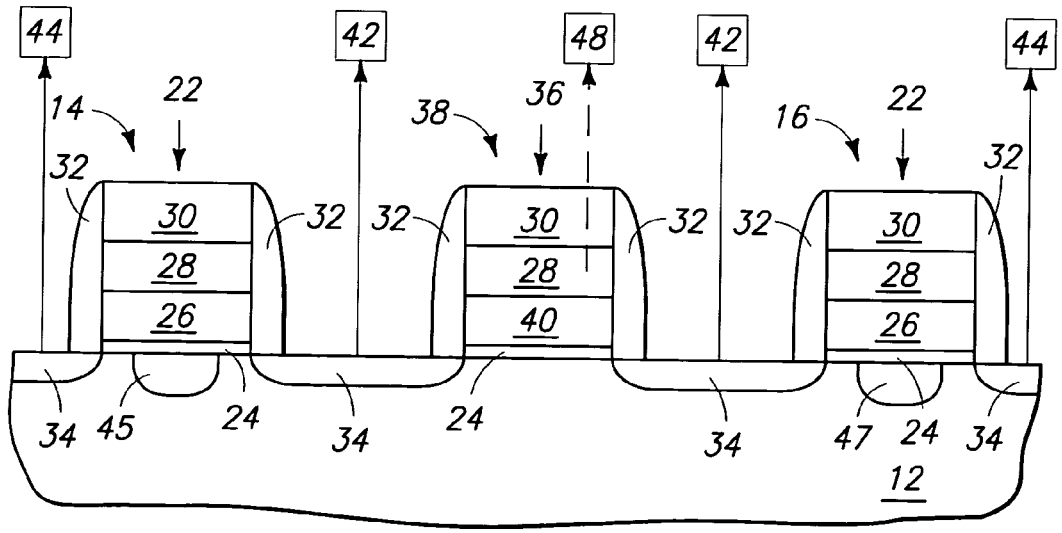
FIG. 21 is a diagrammatic, cross-sectional view of a fragment of a semiconductor wafer construction which can be formed in a third embodiment of the present invention.

FIG. 21 shows an alternative semiconductor construction 10 that can be formed utilizing methods of the present invention. The construction shown in FIG. 21 can be identical to the construction shown in FIG. 14 with an exception being the absence of the pocket implant region underlying isolation device 38. Although FIG. 21 depicts a complete absence of pocket implant beneath the isolation device, the invention encompasses constructions having a pocket lightly doped with indium (i.e. less than about $1 \times 10^{12}$ atoms/cm$^3$, not shown). In constructions of the present invention having a lightly doped indium pocket or an absence of doped pocket beneath isolation device 38, the isolation device can comprise a majority p-type doped layer 40 (discussed above). As will be understood by those of ordinary skill in the art, construction 10 of FIG. 21 can be formed utilizing the methods discussed with reference to FIGS. 15–20 above combined with alternative photolithographic patterning of the masking material 102 (FIG. 2). Such alternate patterning can expose regions of the substrate corresponding to the eventual location of transistor devices 14 and 16 while covering other areas of the substrate, including the area that will eventually underlie isolation device 38.

FIG. 22 illustrates a semiconductor construction 10 encompassed by another aspect of the present invention. Construction 10, as shown in FIG. 22, can be formed by optional processing steps in addition to those described with reference to forming the construction shown in FIG. 14. As shown in FIG. 22, at least some of the source/drain regions 34 present in construction 10 can comprise extension regions 50, 52 which can extend the associated source/drain region farther beneath an associated gate device 14, 16. Extension regions 50 and 52 can extend the associated source/drain region 34 such that the source drain region extends the full width of an overlying spacer 32. Alternatively, the extensions can extend the source/drain region to less than the full spacer width beneath the corresponding device, or can extend the source/drain region partially beneath gate stack 22.

In particular embodiments, source/drain regions 34 can be majority doped with n-type dopant, and extension regions 50 and 52 can be majority doped with a p-type dopant. In preferred embodiments, extensions 50 and 52 can comprise a heavy p-type dopant such as, for example, indium. An appropriate indium concentration within the extensions can be from about $1\times10^{12}$ atoms/cm$^2$ to about $3\times10^{12}$ atoms/cm$^2$.

As shown in FIG. 22, semiconductor construction 10 comprising source/drain extensions 50, 52 can be formed to have such extensions beneath only one of the pair of sidewalls 32 associated with a given stack 22. In other words, extension implants 50, 52 can be provided on a single side of a corresponding transistor device 14, 16. Preferably, as shown in FIG. 22, extensions 50 and 52 are provided only on bit contact sides of gates 14 and 26 and are absent from the source/drain region on the opposing storage node sides of the gates. It can be advantageous to utilize indium implant extensions of source/drain regions associated with bit contact sides of transistor devices 14 and 16 to allow a reduction in the amount of indium utilized in channel pocket implants 45 and 47. In the presence of extensions 50 and 52, pocket channel regions 45 and 47 can comprise an indium concentration of from about $2\times10^{12}$ atoms/cm$^2$ to about $5\times10^{12}$ atoms/cm$^2$ and can additionally comprise boron at the concentrations set forth above with respect to the semiconductor construction shown in FIG. 14.

A method of forming the construction of FIG. 22 is described with reference to FIGS. 23–24. Referring to FIG. 23, such illustrates further processing of a construction similar to that shown in FIG. 14 prior to connection to any capacitor construction or digit lines. A masking material 174 is formed over construction 10 and is patterned to expose portions of the substrate on what will be future bit line contact sides of transistor devices 14 and 16. Masking material 174 can comprise, for example, photoresist; and can be patterned utilizing suitable photolithographic processes.

Figure 24:
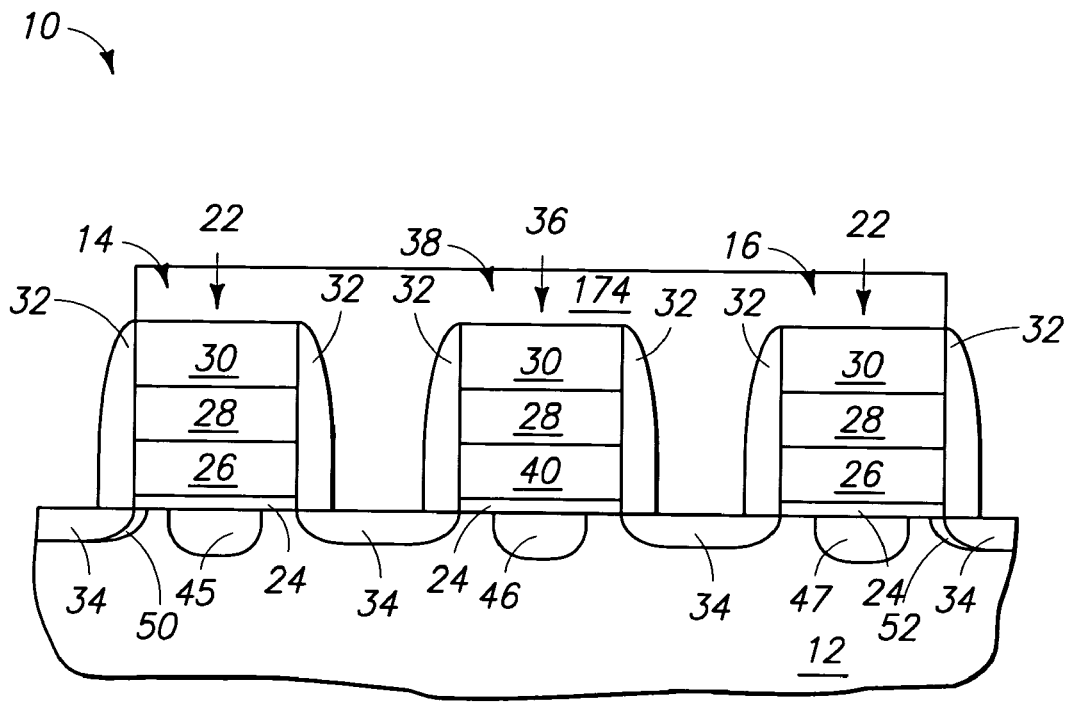
FIG. 24 is a view of the FIG. 2 fragment shown at a processing step subsequent to that of FIG. 23.

A dopant 176 is implanted relative to construction 10 and forms extension regions 50 and 52 shown in FIG. 24. Dopant 176 can be implanted using angled implant techniques typically utilized for forming halo implants relative to a gate. Implant regions 50 and 52 differ from typical halo implants, however, in that implants 50 and 52 do not form a ring shaped structure since dopant is implanted only on one side of the corresponding gate, the opposing side of the gate being blocked by masking material 174. Dopant 176 can comprise a p-type dopant and preferably comprises a heavy p-type dopant such as indium.

The semiconductor construction shown in FIG. 24 can be further processed to remove photoresist material 174 and to form the construction shown in FIG. 22.

Figure 25:
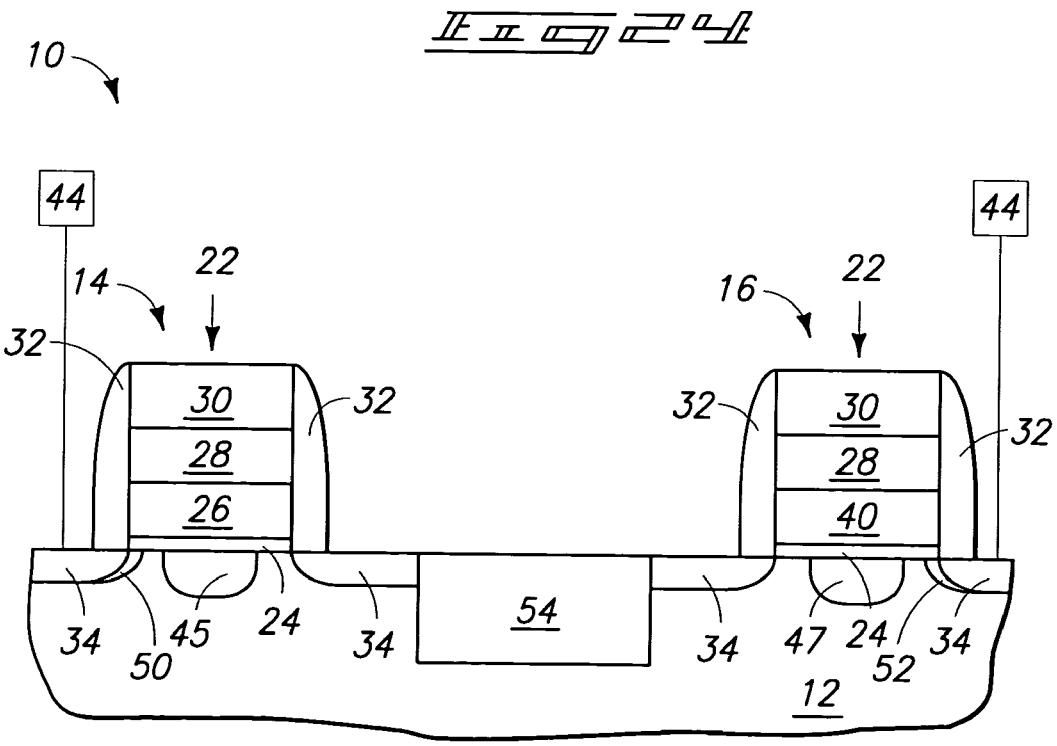
FIG. 25 is a diagrammatic, cross-sectional view of a fragment of a semiconductor wafer construction which can be formed in a fifth embodiment of the present invention.

FIG. 25 illustrates a semiconductor construction 10 encompassed by another aspect of the present invention and will be described using similar numbering as was used above in FIGS. 1–24 where appropriate. The construction 10 shown in FIG. 25 is similar to the construction illustrated in FIG. 22 with an exception being the presence of a shallow trench isolation region 54 in place of the isolation device 38 (FIG. 14).

As will be understood by those skilled in the art, construction 10 as shown in FIG. 25 can be formed utilizing conventional shallow trench isolation region formation combined with various methods of the present invention described above. Shallow trench region 54 can be formed at an initial processing step prior to formation of patternable material 102 (FIG. 2). Material 102 can then be patterned by methods discussed above to expose the regions of substrate while leaving other regions covered. Coating material 144 can be formed and processed to expose regions that will eventually underlie central portions of stacks 22 while other regions, including the shallow trench isolation region, remain masked. Channel pockets 45 and 47 can then be formed as described above, followed by formation of the additional features shown in FIG. 25.

Although FIGS. 22 and 25 show implant extensions 50 and 52 being utilized in conjunction with channel pocket regions 45 and 47, it is to be understood that the invention encompasses embodiments wherein extensions 50 and 52 are utilized in semiconductor constructions in an absence of the described pocket regions 45 and 47.

In addition to the above described embodiments, the invention includes damascene processes for forming gate constructions. An exemplary method of forming a construction utilizing a damascene process is described with reference to FIGS. 26–29.

Figure 26:
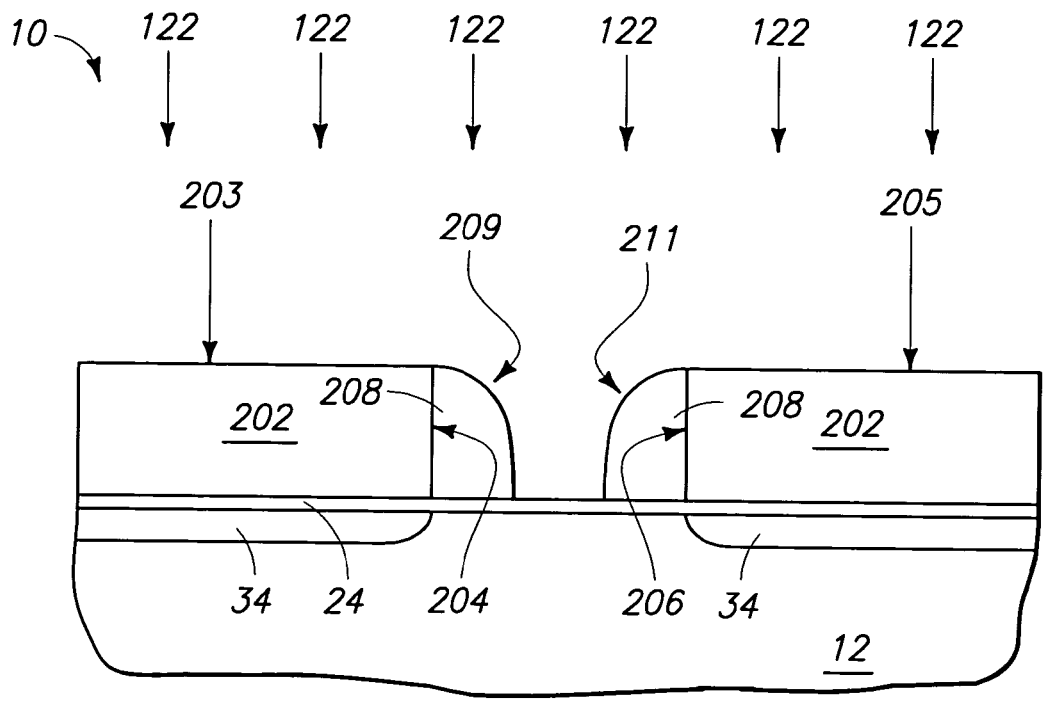
FIG. 26 is a diagrammatic, cross-sectional view of a fragment of a semiconductor wafer construction at a preliminary stage of a fabrication sequence according to an alternative embodiment of the present invention.

Referring to FIG. 26, an initial step can comprise depositing a layer of dielectric material 202 over insulative material 24. Alternatively, dielectric layer 202 can be deposited on substrate 12 in an absence of an insulative layer and insulative material 24 can be grown after the damascene process. Source-drain regions 34 can be present prior to depositing dielectric layer 202 as shown in FIG. 26, or can be formed during or after gate formation.

Figure 27:
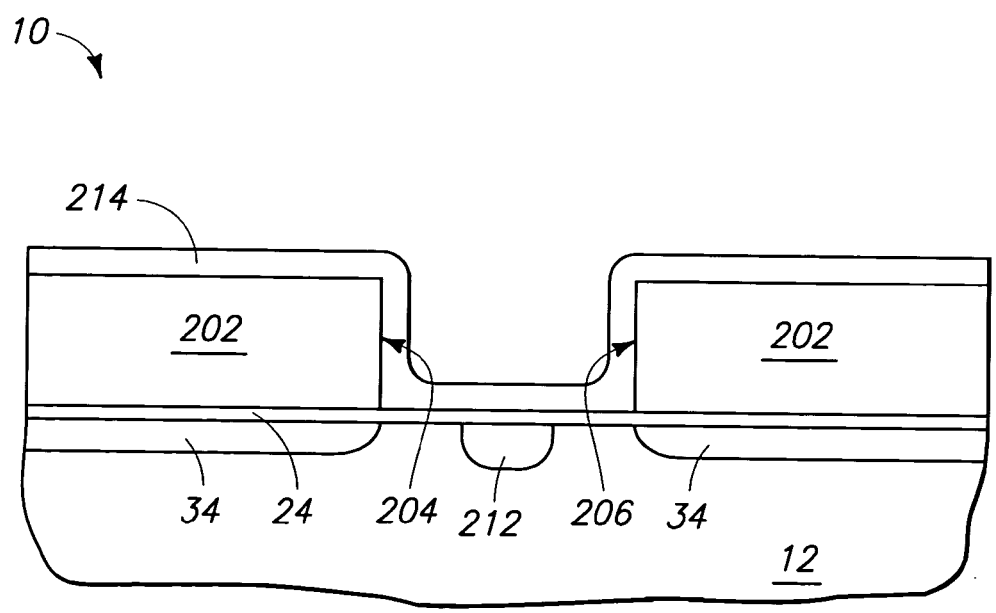
FIG. 27 is a view of the FIG. 26 wafer fragment shown at a processing stage subsequent to that of FIG. 26.

Dielectric material 202 can be patterned by conventional methods, such as photolithography, to form patterned blocks 203 and 205, the blocks having sidewalls 204 and 206 being separated by a gap. Removable spacers 208 can be formed along sidewalls 204 and 206. Removable spacers 208 can be formed for example, by depositing a layer of sacrificial material and anisotropically etching the sacrificial material. Spacers 208 have lateral edges 209 and 211 that are separated by a narrowed gap relative to the distance between sidewalls 204 and 206. A dopant 122 (discussed above) is implanted relative to construction 10 to form a doped pocket region 212 as shown in FIG. 27. Doped pocket region 212 has a width corresponding to the width between lateral edges 209 and 211.

Figure 28:
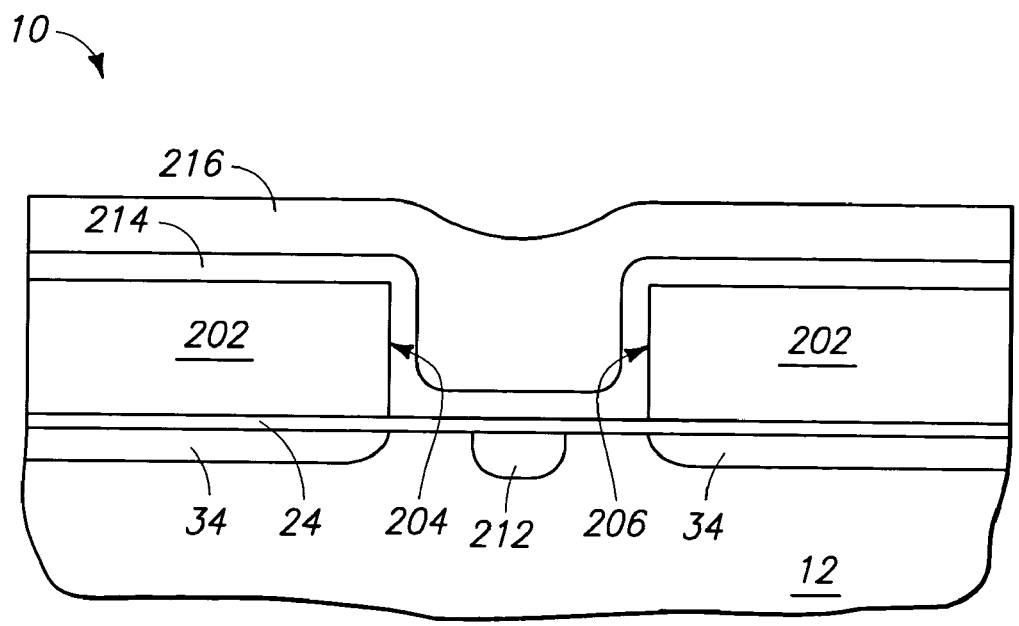
FIG. 28 is a view of the FIG. 26 fragment shown at a processing stage subsequent to that of FIG. 27.

Referring to FIG. 27, spacers 208 are removed and a layer of polysilicon 214 is conformally deposited over construction 10 and along sidewalls 204 and 206. A gate electrode material 216, such as WN/W or other compositions comprising a metal and/or metal nitride, can be deposited over polysilicon layer as shown in FIG. 28.

Figure 29:
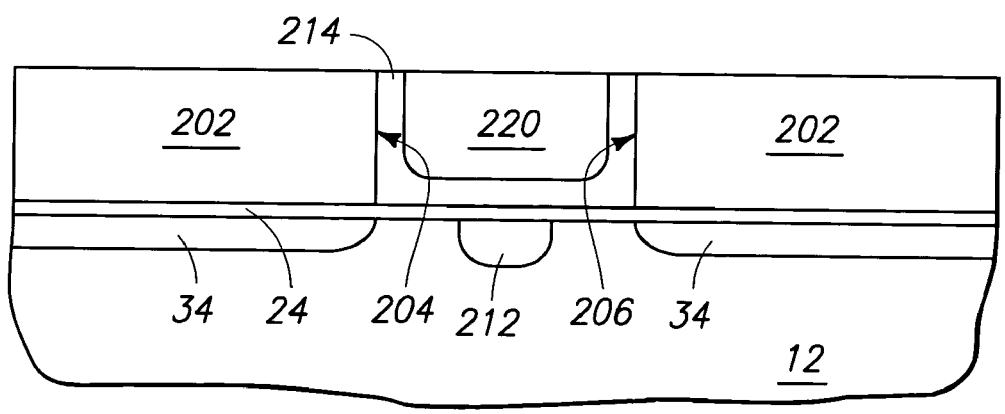
FIG. 29 is a view of the FIG. 26 fragment shown at a processing stage subsequent to that of FIG. 28.

Referring to FIG. 29, a planarization step utilizing for example chemical mechanical polishing is performed to form the planarized gate structure having a metal gate electrode 220 as shown. The gate structure can have a gate structure width corresponding to the distance between the sidewalls 204 and 206. Accordingly, doped pocket region 212 can have a width that is less than the width of the gate structure and in particular embodiments, pocket region 112 can comprise a width less than or equal to about half the width of the gate structure.

A channel region which underlies the damascene gate structure and surrounding pocket (shown in FIG. 29) region can additionally comprise boron as discussed above relative to gate stack structures 22 and 36. Source-drain extensions (not shown) can b utilized in conjunction with the gate and can be formed as described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor construction, comprising:
    forming a layer of dielectric material over a semiconductive substrate material;
    patterning the dielectric material utilizing photolithographic processing to form at least two patterned blocks, a pair of adjacent blocks being separated by a first gap, each block having a sidewall within the first gap formed during the photolithographic processing;
    forming a pair of spacers along the sidewalls and within the first gap, the spacers having lateral edges separated by a second gap, the second gap being narrower than the first gap;
    while the spacers remain along the sidewalls, implanting at least one dopant into the semiconductive material within the second gap to form a doped region;
    removing the spacers from along the sidewalls;
    after removing the spacers, conformally depositing a layer of polysilicon over the semiconductive material within the gap and along the sidewalls; and
    after depositing the layer of polysilicon, depositing a metal-comprising material comprising at least one of a metal and a metal nitride within the gap.

2. The method of claim 1 further comprising planarizing the metal-comprising material.

3. The method of claim 1 wherein the metal-comprising material comprises tungsten.

4. The method of claim 1 wherein the at least one dopant comprises indium.

5. The method of claim 1 wherein the second gap is less than or equal to half the width of the first gap.

* * * * *

UNITED STATES PATENT AND TRADEMARK OFFICE
CERTIFICATE OF CORRECTION

PATENT NO. : 7,087,478 B2
APPLICATION NO. : 10/624627
DATED : August 8, 2006
INVENTOR(S) : Tran It is certified that error appears in the above-identified patent and that said Letters Patent is hereby corrected as shown below:

Column 1, Line 63 – Replace "Ga or TI" with --Ga or T1--.

Column 5, Line 6 – Replace "source drain regions" with --source/drain regions--.

Column 5, Line 23 – Replace "can comprises" with --can comprise--.

Column 5, Line 61 – Replace "alter electrically" with --alter electrical--.

Column 6, Line 8 - Replace "Ga or TI" with --Ga or T1--.

Column 10, Line 11- Replace "some Portion" with --some portion--.

Column 10, Line 43 – Replace "of the of the" with --of the--.

Column 11, Line 15 – Replace "pattern d" with --patterned--.

Column 11, Line 50 – Replace "center d" with --centered--.

Column 12, Line 57 – Replace "source drain region" with --source/drain region--.

UNITED STATES PATENT AND TRADEMARK OFFICE
CERTIFICATE OF CORRECTION

PATENT NO.        : 7,087,478 B2
APPLICATION NO. : 10/624627
DATED             : August 8, 2006
INVENTOR(S)       : Tran It is certified that error appears in the above-identified patent and that said Letters Patent is hereby corrected as shown below:

Column 14, Line 56 – Replace "can b" with --can be--.

Signed and Sealed this

Twenty-ninth Day of May, 2007

JON W. DUDAS
*Director of the United States Patent and Trademark Office*